United States Patent [19]

Okada et al.

[11] Patent Number: 4,502,286
[45] Date of Patent: Mar. 5, 1985

[54] CONSTANT PRESSURE TYPE BOILING COOLING SYSTEM

[75] Inventors: Sadayuki Okada, Katsuta; Hisao Sonobe, Ibaraki; Tomoaki Mino, Hitachi, all of Japan

[73] Assignee: Hitachi, Ltd., Tokyo, Japan

[21] Appl. No.: 520,514

[22] Filed: Aug. 4, 1983

[30] Foreign Application Priority Data

Aug. 11, 1982 [JP] Japan .................................. 57-138395

[51] Int. Cl.³ .................................................. F25D 19/00
[52] U.S. Cl. ..................................... 62/119; 165/104.21
[58] Field of Search ....................... 62/119; 165/104.21

[56] References Cited
U.S. PATENT DOCUMENTS

| | | | |
|---|---|---|---|
| 2,499,736 | 3/1950 | Kleen | 62/119 |
| 2,711,882 | 6/1955 | Narbutovskih | 62/119 |
| 3,561,229 | 2/1971 | Levin | 62/119 |
| 3,580,003 | 5/1971 | Dolan | 62/119 |
| 3,906,261 | 9/1975 | Ogura et al. | 165/104.21 |
| 4,182,409 | 1/1980 | Robinson, Jr. | 165/104.21 |
| 4,393,663 | 7/1983 | Grunes et al. | 62/119 |

Primary Examiner—Ronald C. Capossela
Attorney, Agent, or Firm—Antonelli, Terry & Wands

[57] ABSTRACT

A constant pressure boiling cooling system including evaporators, a condenser and a liquid refrigerant sump, wherein the evaporators and the condenser are arranged substantially horizontally in side-by-side relation, and the first communicating tubes connect the upper portions of the evaporators to the upper portions of the condenser respectively, and the second communicating tubes connect the lower portions of the evaporators to the lower portions of the condenser respectively.

5 Claims, 5 Drawing Figures

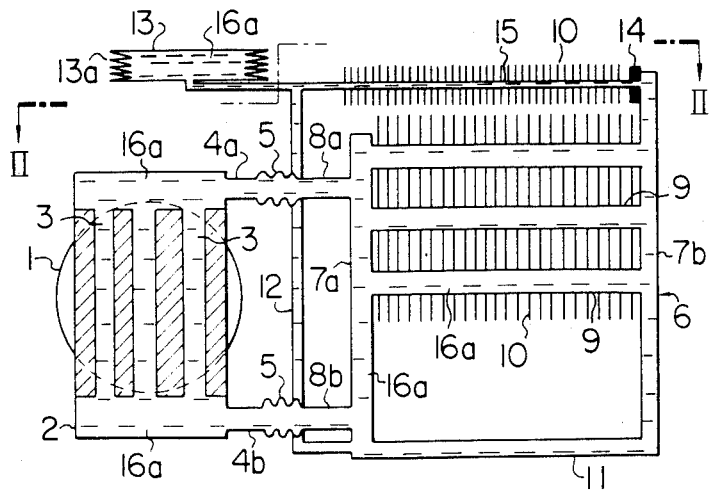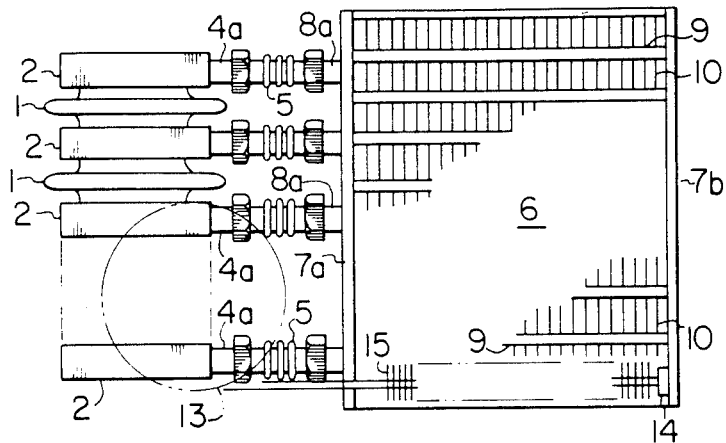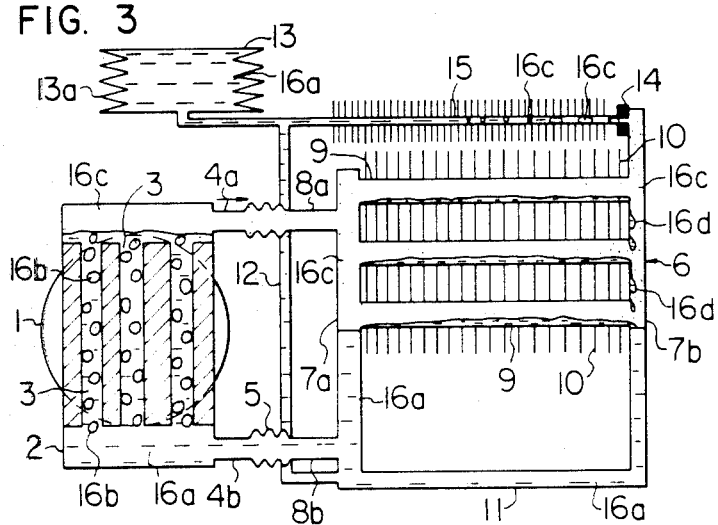

CONSTANT PRESSURE TYPE BOILING COOLING SYSTEM

BACKGROUND OF THE INVENTION (1) Field of the Invention

This invention relates to boiling cooling systems suitable for effecting cooling of heat generating bodies by utilizing the boiling and condensing of a refrigerant, and more particularly it is concerned with a constant pressure type boiling cooling system capable of effecting cooling by maintaining the internal pressure of the system at atmospheric pressure level at all times.

(2) Description of the Prior Art

As semiconductor elements for use with a power system, such as thyristors, transistors, etc., have grown larger in capacity, boiling cooling systems have become popular for effecting cooling of these elements which utilize boiling and condensing of a refrigerant, such as Freon, to achieve excellent cooling function.

In many boiling cooling systems of the prior art that have hitherto been in use, the refrigerant in a liquid state is contained in a vacuum vessel for sealing the refrigerant therein. In this closed type of boiling cooling systems using a closed type refrigerant container, the internal pressure of the container varies from a condition which is substantially vacuum to a condition in which the pressure rises to about two atmospheric pressures depending on the thermal load applied thereto during cooling operations. This makes it essential to provide the container with a construction which could withstand such great fluctuations in its internal pressure. This would cause a large increase in cost.

To obviate the aforesaid disadvantages of boiling cooling systems of the closed type using a vacuum vessel, proposals have been made to use a constant pressure type boiling cooling system using a container for a liquid refrigerant which is provided with a liquid sump of a variable volume type utilizing bellows, for example, so that the system is able to operate while keeping its internal pressure substantially at the atmospheric pressure level regardless of changes in thermal load from room temperature to the maximum level. Such boiling cooling system has been put to practical use.

In the boiling cooling system of the aforesaid constant pressure type, when the evaporator has its temperature kept at a room temperature level, all the refrigerant passages including the interior of the condenser are filled with a refrigerant in a liquid state and the liquid sump of the variable volume type is in a condition of minimum volume. As the temperature of heat generating bodies, such as semiconductor elements, rises to apply a thermal load to the evaporator, the refrigerant in the evaporator boils and produces vapor by absorbing a large amount of latent heat of vaporization and the vapor condenses in the condenser to release a large amount of heat to the atmosphere, to thereby effect cooling. At this time, an increment of the volume of the refrigerant is cancelled out by an increase in the volume of the liquid sump of the variable volume type, so that cooling can be carried out at atmospheric pressure without an increase in internal pressure.

The boiling cooling system of the aforesaid construction offers the advantage that, since the internal pressure of the container including the evaporator and the condenser for the refrigerant to be sealed in can be kept at a level substantially equal to the atmospheric pressure irrespective of whether or not a thermal load is present, the need to use a pressure vessel is eliminated and the costs can be reduced.

In the constant pressure type boiling cooling system of the prior art, it is usual practice to arrange the evaporator and the condenser vertically so that the condenser is disposed above the evaporator to enable the refrigerant vapor produced in the evaporator to flow efficiently into the condenser.

When the cooling system of the aforesaid construction is used for cooling the semiconductor element referred to hereinabove, the evaporator and the semiconductor elements are assembled with each other in intimate contact condition, with the result that the evaporator, the semiconductor elements to be cooled by means of the evaporator and various electric accessory parts necessary for the semiconductor elements are located below the condenser.

Thus when the aforesaid constant pressure type boiling cooling system is applied to semiconductor elements, it would be necessary to efficiently pass a cooling air current from below toward the condenser located above the evaporator, making it impossible to effect cooling of the semiconductor elements satisfactorily with natural air currents. Even if forced circulation of air were relied on to obtain a satisfactory flow of cooling air, such measures would involve a rise in cost because a complex construction of an air passageway for guiding the cooling air current would make it necessary to increase the capacity of the blower to cope with an increase in the resistance offered to the flow of the cooling air.

Also, in the constant pressure type boiling cooling system of the prior art, the arrangement whereby the evaporator and the condenser are arranged vertically in superposed relation increases the vertical dimension of the semiconductor device in which the cooling system is incorporated, making it impossible to obtain a compact overall size in a semiconductor device.

SUMMARY OF THE INVENTION

This invention has been developed for the purpose of obviating the aforesaid disadvantages of the prior art. Accordingly the invention has as its object the provision of a constant pressure type boiling cooling system in which the evaporators and the condenser are arranged horizontally in side-by-side relation and yet circulation of the refrigerant can be achieved satisfactorily, so that the efficiency with which the cooling air current flows can be increased and a compact overall size can be obtained in a constant pressure type boiling cooling system.

To accomplish the aforesaid object, the invention provides some upper refrigerant passageways and some lower refrigerant passageways for maintaining in communication the evaporators and the condenser arranged horizontally in side-by-side relation.

BRIEF DESCRIPTION OF THE DRAWINGS

FIG. 1 is a sectional side view of the constant pressure type boiling cooling system comprising one embodiment of the invention;

FIG. 2 is a top plan view as seen along the lines II—II in FIG. 1;

FIG. 3 is a sectional side view of the embodiment shown in FIG. 1, showing the cooling system in a condition for performing a boiling cooling operation;

DESCRIPTION OF THE PREFERRED EMBODIMENTS

Figure 4:
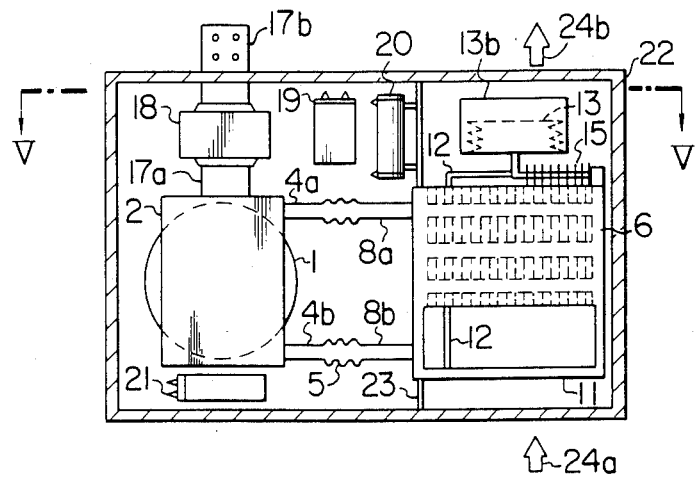
FIG. 4 is a side view of another embodiment.

Preferred embodiments of the constant pressure type boiling cooling system in conformity with the invention will now be described by referring to the accompanying drawings.

FIG. 1 shows one embodiment of the invention incorporated in a semiconductor device for cooling semiconductor elements, and FIG. 2 is a top plan view as seen along the lines II—II in FIG. 1. In these figures, the numeral 1 designates semiconductor elements, such as thyristors, suitable for use with a power system of high magnitude, and the numeral 2 evaporators. 4a and 4b are communicating tubes, and 5 insulating joints. 6 is a condenser, and 6a and 7a headers. 8a and 8b are communicating tubes, 9 condensing tubes and 10 heat dissipating fins. 11 designates liquid return tubes, and 12 a communicating tube. 13 is a liquid sump, and 13a an expanding and contracting section. 14 is a throttle, 15 a gas release tube and 16a a refrigerant in a liquid state.

A predetermined number of evaporators 2 are located to hold a plurality of semiconductor elements 1 therebetween, and the portions of the evaporators 2 in contact with the semiconductor elements 1 are formed into blocks made of aluminum, copper or other material of high thermal conductivity in which a multiplicity of boiling passageways 3 arranged vertically are provided. The upper communicating passageways 4a and lower communicating passageways 4b are connected to upper and lower portions of the boiling passageways 3 respectively, so that the plurality of semiconductor elements 1 are connected together electrically through the evaporators 2 and the evaporators 2 can serve as terminals for the respective semiconductor elements 1.

In the condenser 6, a plurality of condensing tubes (heat dissipating tubes) 9 are located substantially horizontally between the two headers 7a and 7b substantially vertically located, and provided with the heat dissipating fins 10. The communicating tubes 8a connect the header 7a with the upper communicating tubes 4a of the evaporators through the insulating joints 5, and the communicating tubes 8b connect the header 7a with the lower communicating tubes 4b of the evaporators through the insulating joints 5, to thereby maintain communication between the plurality of evaporators 2 and the condenser 6. As described hereinabove, each evaporator 2 acts as a portion charged by the terminal voltage of the associated semiconductor element 1, so that the insulating joint 5 is provided between the communicating tube 4a, 4b and 8a, 8b to insulate one from the other.

The liquid return tubes 11 connect the headers 7a and 7b together at their lower portions, to ensure that passageways are provided to the refrigerant in a liquid state returning from the condenser 6 to the evaporators 2 through the header 7a.

The liquid sump 13 is a cylindrical vessel provided at its side with the expanding and contracting portion 13a in the form of a bellows, so that the interior of the liquid sump 13 can be varied in a predetermined range of volumes while keeping the internal pressure at atmospheric pressure level. The liquid sump 13 located above the evaporators 2 is connected to a lower portion of the header 7a via the communicating tube 12 and connected to an upper portion of the header 7b via the gas release tube 15. The throttle 14 is mounted at the junction between the gas release tube 15 and the upper portion of the header 7b so that only the vapor collected in the upper portion of the header 7b (this portion is designed to be located in an uppermost position of all the refrigerant passageways including the evaporators 2 and condenser 6) will be drawn off the header 7b into the gas release tube 15.

Although not shown, the plurality of semiconductor elements 1 and the plurality of evaporators 2 alternately arranged one over another in superposed relation are clamped together into a unitary structure by fastening members at opposite ends, to thereby provide a semiconductor stack.

The refrigerant 16a has a boiling point in the range between 50° C. and 90° C. and may be selected from those of the Freon system or the perfluorocarbon system including perfluoro-2-methylpantane (2-$CF_3C_3F_n$), perfluoromethylcyclohexane ($C_5F_nCF_3$), perfluorotriethylamine [$(CF_3CF_2)_2N$], perfluorocyclic ether ($C_7F_{14}O$), trichloropentafluoropropane ($CCl_3CF_2CF_3$) and trichlorotrifluoroethane ($CCl_2FCClF_2$). The refrigerant 16a is sealed in the system such that it is filled in all portions of the evaporators 2, condenser 6, liquid sump 13 and the communicating passageways connecting these parts together. When the refrigerant 16a is in the aforesaid condition, the inner volume of the liquid sump 13 shows a minumum value of all the values through which the inner volume may vary.

Operation will be described. Assume that the semiconductor elements 1 are kept at room temperature. Then portions of the refrigerant 16a in the evaporators 2, condenser 6 and other parts of the system are kept at the same temperature, so that the refrigerant is at rest.

If an electric current is passed to the semiconductor elements 1 and vaporization is started, the portion of the refrigerant 16a in the evaporators 2 becomes higher in temperature than those in other parts of the system with an attendant rise in volume and a drop in specific gravity, so that the refrigerant 16a in the evaporators 2 flows upwardly through the boiling passageways 3 and through the communicating passageways 4a and 8a into the header 7a of the condenser 6. From the header 7a, the refrigerant 16a flows through the condensing tubes 9 to the header 7b while releasing heat through the fins 10 into the air and having its temperature drop. The refrigerant 16a whose temperature is dropping close to room temerature shifts from the lower portion of the header 7b through the liquid return tube 11 to the lower portion of the header 7a, from which it flows through the communicating tubes 8b and 4b to the lower portions of the evaporators 2. In this condition, heat is released from the semiconductor elements 1 by the refrigerant 16a in a liquid state or a subcooled boiling state which is circulating between the evaporators 2 and the condenser 6 by connection, so that the temperature of the refrigerant 16a in the liquid state is varied in accordance with the amount of heat given off by the semiconductor elements 1 to the evaporators 2.

Assume then that while heat dissipation from the semiconductor is taking place on account of the refrigerant 16a in the liquid state circulating as aforesaid the heat load applied to the evaporators 2 further increases and the temperature of the refrigerant 16a reaches its boiling point. This causes the refrigerant 16a in the evaporators 2 to start boiling. FIG. 3 shows the system in this condition, in which 16b designates bubbles of the refrigerant 16a produced by the boiling refrigerant in the boiling passageways 3 while 16c and 16d designate a refrigerant in a gaseous state and a refrigerant just changed to a liquid state by condensation from a gaseous state, respectively.

A large amount of bubbles 16b produced in the boiling passageways 3 by the refrigerant 16a in the boiling state flow through the upper communicating tubes 4a and 8a to the header 7a, from which they flow through the condensing tubes 9 of the condenser 6 to the header 7b. In this process, the bubbles 16b are cooled by the cooling air through the fins 10 back to a liquid state 16d and the liquid refrigerant 16d returns from the lower portion of the header 7b to the lower portions of the evaporators 2 through the liquid return tube 11.

When boiling of the refrigerant 16a in the evaporators 2 and condensing of the gaseous refrigerant 16c in the condenser 6 take place simultaneously, heat transfer is effected through the evaporators 2 and condenser 6 with a much higher degree of efficiency than heat transfer effected by the liquid refrigerant 16a flowing in circulation, so that the boiling cooling system functions fully by performing release of heat satisfactorily under a high thermal load. This makes it possible to raise the temperature to a predetermined range and keep it at such range by using a cooling system of relatively small capacity with respect to a loss of the semiconductor elements 1.

In the embodiment shown and described, circulation of the refrigerant 16a takes place smoothly by convection while the refrigerant 16a is in the liquid state and then the system shifts to boiling cooling with an increase in thermal load. Because of this, there is no trouble caused by the arrangement of the evaporators 2 and the condenser 6 substantially horizontally in performing boiling cooling operations, thereby enabling excellent and stable boiling cooling performance to be obtained.

As the system shifts to the boiling cooling condition as aforesaid, the bubbles 16b and gas 16c of the refrigerant 16a are produced as shown in FIG. 3. Thus the system could not function as one of constant pressure type unless the portions of the system containing the refrigerant 16a had their volumes increased. In the embodiment shown and described, when the bubbles 16b and gas 16c are produced, the refrigerant 16a in the liquid state flows in an amount corresponding to the volume of the bubbles 16b and gas 16c from the lower portion of the header 7a through the communicating tube 12 to the liquid sump 13 to increase the volume thereof. The change in the volume of the liquid sump 13 takes place under atmospheric pressure, so that the internal pressure of the system can be kept substantially equal to the atmospheric pressure even while boiling cooling is being performed, to thereby enable the system to function as one of constant pressure type.

In many cases, air is dissolved in the refrigerant 16a, and if the air is separated from the refrigerant 16a while cooling is being performed, the results achieved by boiling cooling might be reduced.

The trouble referred to hereinabove can be obviated as follows in the embodiment shown and described. The air separated from the liquid refrigerant 16a is lighter than the refrigerant regardless of whether it is in a liquid state or a gaseous state, so that it is collected in the upper portion of the header 7b which is the uppermost portion of the system, from which it flows through the throttle 14 and gas release tube 15 to the upper portion of the liquid sump 13. Thus the air which might be dissolved in the refrigerant 16a does not interfere with the cooling operation performed by the system. At this time, gaseous refrigerant might be mingled with the air flowing through the throttle 14 and gas release tube 15. Such gaseous refrigerant is cooled in the tube 15 to back to a liquid state, so that there is no trouble of gaseous refrigerant being collected in the liquid sump 13.

Figure 5:
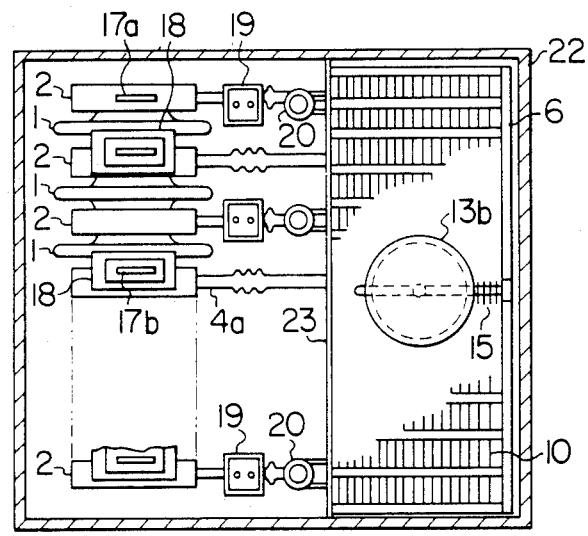
FIG. 5 is a top plan view as seen along the lines V—V in FIG. 4.

FIG. 4 shows another embodiment in a sectional side view, and FIG. 5 is a top plan view as seen in the direction of lines V—V in FIG. 4. In this embodiment, the boiling cooling system according to the invention is incorporated in a semiconductor device which is utilized as a packaged unit in which electric accessory parts necessary for the semiconductor elements are in a self-contained assembly. In the FIGS. 17a and 17b are terminals of the semiconductor elements 1 attached to the evaporators 2 and terminals for connecting the semiconductor elements to external circuits respectively. 18 designates fuses, 19 capacitors, 20 resistors, 21 transformers, 22 a frame and 23 a partition plate. Other parts shown in FIGS. 4 and 5 are similar to those shown in FIGS. 1-3. 13b designates a cover for the liquid sump 13, and 24a and 24b are arrows indicating the direction in which cooling air flows.

The embodiment shown in FIGS. 4 and 5 is distinct from that shown in FIGS. 1-3 in that the cover 13b is provided to the liquid sump 13 which is located above the condenser 6, and the arrangement of the communicating tube 12 and gas release tube 15 is distinct from the corresponding arrangement shown in FIGS. 1-3.

The fuses 18 which are interposed between the terminals 17a and 17b perform the function of protecting the semiconductor elements 1.

The capacitors 19 and resistors 20 are connected between an anode and a cathode of each semiconductor elements 1 to protect the semiconductor elements from a surge voltage. They are located above the communicating tubes 4a and 8a.

The transformers 21 which are for pulse currents are located below the semiconductor elements 1 and evaporators 2 forming a stack.

The frame 22 is utilized for forming the semiconductor device with its accessory parts and the boiling cooling system into a unit and the partition plate 23 is located inside the frame 22 and cooperates with walls of the frame 22 to define a passageway for air currents for cooling the condenser 6.

It will be seen that the embodiment shown in FIGS. 4 and 5 enables the semiconductor elements 1 with their accessory parts and the boiling cooling system to be formed into a packaged unit. The provision of the partition plate 23 provides a shield for the electric components including the semiconductor elements 1 against the cooling air currents indicated by the arrows 24a and 24b. This is conducive to smooth air flow for cooling the condenser 6 and prevention of dust from entering the electric components section. An additional advantage is that the absence of no structures and parts on opposite sides of the evaporators 2 facilitates replacements of the semiconductor elements 1.

In the embodiments shown and described hereinabove, a plurality of evaporators 2 are used and kept in contact with the outer side of semiconductor elements 1 to cool the elements. It is to be understood that the invention is not limited to the aforesaid arrangement of the evaporators and semiconductor elements and that boiling cooling can be effected by what is usually referred to as a system of directly immersing the semiconductor elements in a refrigerant in which a vessel of a predetermined size and shape is used for containing the refrigerant and a stack of semiconductor elements composed of semiconductor elements and cooling fins serves as an evaporator.

In cooling the condenser with air, natural circulation or foced circulation may be relied on as desired. In place of air, water may be used as a cooling medium.

While the invention has been shown and described as being incorporated in a semiconductor device, it is to be understood that the invention is not limited to this application and that the invention may be used for cooling any heat generating members.

From the foregoing description, it will be appreciated that according to the invention the evaporators and the condenser are arranged substantially horizontally in side-by-side relation, so that the disadvantages of the prior art described in the background ground of the invention can be readily eliminated. The invention makes it possible to obtain a compact overall size in a boiling cooling system because its height can be reduced, and enables the performance of the boiling cooling system to be improved because the resistances offered to the flow of cooling air currents for the condenser can be minimized. Additionally the cost of the constant pressure type boiling cooling system can be greatly reduced.

What is claimed is:

1. A constant pressure boiling cooling system comprising evaporators filled with liquid refrigerant for cooling heating generating bodies, a condenser for cooling and liquefying the vapour of the refrigerant from said evaporators and a variable volume refrigerant sump for absorbing pressure changes caused by the boiling of the refrigerant in said evaporators and said condenser, said evaporators and said condenser being arranged in substantially horizontal-side by side relation and connected with one another at an upper and a lower portions of the side surfaces thereof by means of first and second communicating tubes respectively and said condenser comprising a plurality of condensing tubes located in substantially horizontal relation and two headers located in substantially vertical relation which are respectively connected to the both ends of said condensing tubes.

2. A constant pressure boiling cooling system as claimed in claim 1, wherein said liquid refrigerant sump is located above said evaporators or said condenser.

3. A constant pressure boiling cooling system as claimed in claim 1 or 2, further comprising a gas release tube connecting said liquid refrigerant sump to the upper portion of said condenser, said gas release tube being fitted with a throttle and heat dissipating fins.

4. A constant pressure boiling cooling system as claimed in claim 1, wherein said evaporators comprise heat absorbing sections provided against heat generating sections of a semiconductor device, at least some electric accessory parts of said semiconductor device which are located above said heat absorbing section and means for forming the whole system into a packaged unit including said boiling cooling system.

5. A constant pressure boiling cooling system as claimed in claim 4, further comprising a partition plate in said packaged unit interposed between said evaporators and said condenser.

* * * * *